(12) United States Patent
Kawabata et al.

(10) Patent No.: US 7,672,138 B2
(45) Date of Patent: Mar. 2, 2010

(54) ELECTRONIC APPARATUS

(75) Inventors: Akira Kawabata, Hoi-gun (JP); Yuichiro Fukaya, Nishikamo-gun (JP)

(73) Assignee: DENSO CORPORATION, Kariya (JP)

( * ) Notice: Subject to any disclaimer, the term of this patent is extended or adjusted under 35 U.S.C. 154(b) by 129 days.

(21) Appl. No.: 11/826,851

(22) Filed: Jul. 19, 2007

(65) Prior Publication Data
US 2008/0025006 A1  Jan. 31, 2008

(30) Foreign Application Priority Data
Jul. 27, 2006  (JP)  ............................. 2006-205300

(51) Int. Cl.
*H05K 7/02* (2006.01)
(52) U.S. Cl. ................. 361/752; 361/760; 361/730; 361/728; 174/520
(58) Field of Classification Search ........... 361/760, 361/807, 752, 730, 728; 174/520
See application file for complete search history.

(56) References Cited

U.S. PATENT DOCUMENTS

| | | | | |
|---|---|---|---|---|
| 3,087,982 A | * | 4/1963 | Hayes | ............... 174/546 |
| 3,787,718 A | * | 1/1974 | Patterson | ............... 257/99 |
| 4,968,962 A | * | 11/1990 | Hohider et al. | ............... 337/4 |
| 5,016,139 A | * | 5/1991 | Stopa et al. | ............... 361/720 |
| 5,161,091 A | * | 11/1992 | Hohider et al. | ............... 361/704 |
| 5,204,498 A | * | 4/1993 | Russell | ............... 174/528 |
| 5,391,972 A | | 2/1995 | Gardner et al. | |
| 5,955,776 A | * | 9/1999 | Ishikawa | ............... 257/618 |
| 6,195,261 B1 | | 2/2001 | Babutzka et al. | |
| 6,245,630 B1 | * | 6/2001 | Ishikawa | ............... 438/393 |
| 6,410,185 B1 | | 6/2002 | Takahashi et al. | |
| 6,509,645 B2 | * | 1/2003 | Tatsumi et al. | ............... 257/738 |
| 6,875,029 B2 | | 4/2005 | Kawabata et al. | |

FOREIGN PATENT DOCUMENTS

| | | |
|---|---|---|
| JP | A-2001-285004 | 10/2001 |
| JP | A-2006-120831 | 5/2006 |
| JP | A-2006-310490 | 9/2006 |

OTHER PUBLICATIONS

Extended European Search Report dated Nov. 3, 2008 in corresponding European patent application No. 07014532.1-2214 (and English translation).

* cited by examiner

*Primary Examiner*—Dameon E Levi
(74) *Attorney, Agent, or Firm*—Posz Law Group, PLC (57) ABSTRACT

An electronic apparatus include a housing, a circuit board held in the housing, and large electronic components held in the housing and electrically coupled to the circuit board. The housing has a mounting surface, and the electronic apparatus is mounted to an object at the mounting surface. The large electronic components are arranged in a three-dimensional manner with respect to the mounting surface in such a manner that at least one of the large electronic components overlaps at least one of the large electronic components in a direction toward the mounting surface.

11 Claims, 7 Drawing Sheets

ELECTRONIC APPARATUS

CROSS REFERENCE TO RELATED APPLICATION

This application is based on and incorporates herein by reference Japanese Patent Application No. 2006-205300 filed on Jul. 27, 2006.

FIELD OF THE INVENTION

The present invention relates to an electronic apparatus including large electronic components such as a capacitor and a coil.

BACKGROUND OF THE INVENTION

Figure 11A:
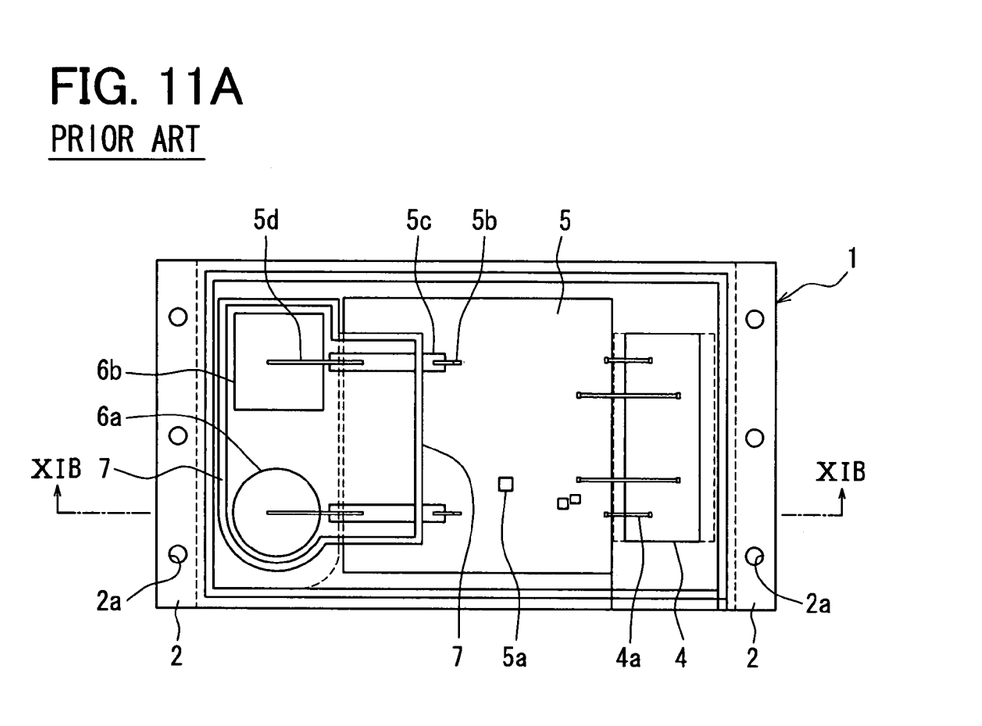
FIG. 11A is a plan view of a conventional electronic apparatus.
Figure 11B:
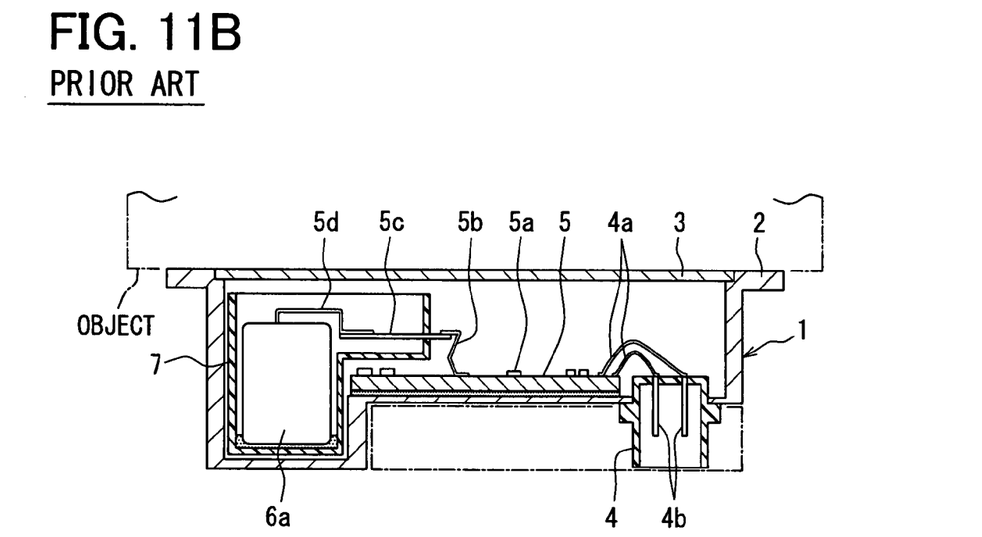
FIG. 11B is a cross-sectional view taken along line XIB-XIB in FIG. 11A.

An electronic apparatus has been proposed that includes large electronic components such as a capacitor and a coil. FIGS. 11A, 11B are schematic views of an electronic apparatus 1 disclosed in U.S. Pat. No. 6,875,029 corresponding to JP-A-2004-79576. As shown in FIGS. 11A, 11B, the electronic apparatus 1 includes a base 2 provided with a mounting hole 2a, a cover 3, a connector 4, a ceramic board 5, and a resin case 7. The cover 3 covers an opening of the base 2 to provide a housing. The connector 4 has a terminal 4b. A surface-mount component 5a is bonded to the ceramic board 5. Large electronic components including a capacitor 6a and a coil 6b are placed in the resin case 7. The capacitor 6a and the coil 6b are electrically connected to the ceramic board 5 through a lead 5d, a busbar 5c, and a metal foil (i.e., ribbon wire) 5b. The ceramic board 5 is electrically connected to the terminal 4b of the connector 4 through a wire 4a. The electronic apparatus 1 has a mounting surface and is mounted to an object at the mounting surface by a screw inserted into the mounting hole 2a of the base 2.

In the electronic apparatus 1, the large electronic components are placed on the same plane with respect to the mounting surface. Therefore, as the number of the large electronic components increases, the size of the electronic apparatus 1 increases in a direction along the mounting surface. As a result, the electronic apparatus 1 requires a larger mounting surface.

SUMMARY OF THE INVENTION

In view of the above-described problem, it is an object of the present invention to provide an electronic apparatus having a small mounting surface where the electronic apparatus is mounted to an object.

An electronic apparatus include a housing, a circuit board held in the housing, and large electronic components held in the housing and electrically coupled to the circuit board. The housing has a mounting surface, and the electronic apparatus is mounted to an object at the mounting surface.

The large electronic components are arranged in a three-dimensional manner with respect to the mounting surface. Specifically, at least one of the large electronic components overlaps at least one of the large electronic components in a direction toward the mounting surface. Thus, the electronic apparatus has a small mounting surface.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
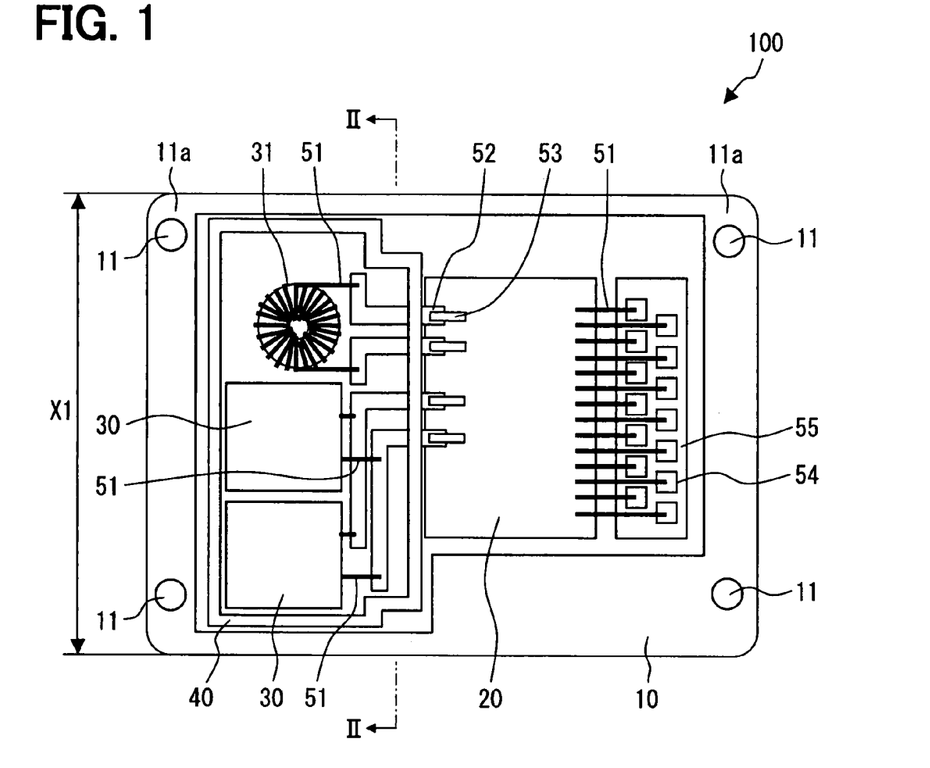
FIG. 1 is a plan view of an electronic apparatus according to a first embodiment of the present invention.
Figure 2:
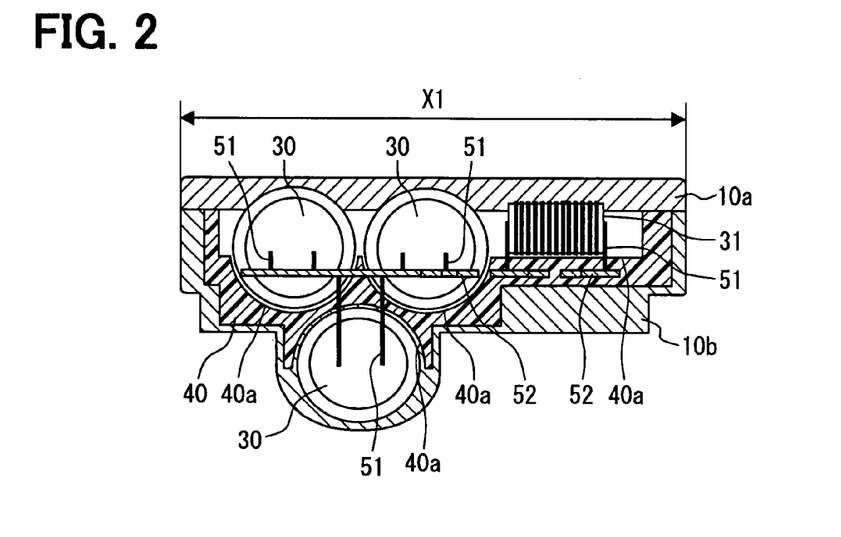
FIG. 2 is a cross-sectional view taken along line 11-11 in FIG. 1.

As shown in FIGS. 1, 2, an electronic apparatus 100 according to a first embodiment of the present invention includes a housing 10, a circuit board 20, capacitors 30, a coil 31, a resin case 40, and a connector 55. The electronic apparatus 100 may be, for example, applied to an engine electronic control unit (ECU).

The housing 10 holds (i.e., accommodates) the circuit board 20, the capacitors 30, the coil 31, and the connector 55. The housing 10 may be, for example, made of synthetic resin, or metal such as aluminum or iron. The housing 10 includes a cover 10a (upper housing) and a base 10b (lower housing). The base 10b is shaped like a substantially rectangular box with an opening. Also, the cover 10a is shaped like a substantially rectangular box. The cover 10a covers the opening of the base 10b so that the housing 10 is formed. The cover 10a and the base 10b may be, for example, shaped by resin injection molding or aluminum die casting.

The base 10b has a connector opening (not shown) via which connector pins of the connector 55 are exposed to outside the housing 10. As shown in FIG. 1, the base 10b has a mounting member 11a provided with a mounting hole 11. The electronic apparatus 100 is mounted to an object (e.g., engine) by a screw inserted through the mounting hole 11. Thus, when the electronic apparatus 100 is mounted to the object, the cover 10a touches the object and serves as a mounting surface of the electronic apparatus 100. The circuit board 20, the resin case 40, and the connector 55 are attached to an inner surface of the base 10b through an adhesive, for example.

In the first embodiment, the cover 10a and the base 10b are shaped to fit the capacitors 30 and the resin case 40 so that the electronic apparatus 1 can has a small size. The cover 10a and the base 10b may have other shape than the rectangular box, as long as the housing 10 can hold the circuit board 20, the capacitors 30, the coil 31, and the connector 55.

The circuit board 20 includes a printed board provided with through holes, land portions, conductive patterns, and via holes connecting the conductive patterns. Small electronic components (not shown) are placed on the circuit board 20. For example, the small electronic components include a microcomputer, a resistor, and a capacitor having relatively small capacitance. The conductive lands 54 of the connector 55 are electrically connected to the land portions of the circuit board 20 through leads 51. The capacitors 30 and the coil 31 are electrically connected to the land portions of the circuit board 20 through the leads 51, busbars 52, and metal foils (ribbon wires) 53. The printed board of the circuit board 20 may be, for example, made of a known material such as thermoplastic resin, thermosetting resin, ceramics, or glass-resin composite (e.g., glass cloth).

The capacitors 30 and the coil 31 are used to produce large power output and are large in size than the small electronic components placed on the circuit board 20. The capacitors 30 and the coil 31 are hereinafter also called "large electronic components". The large electronic components are not placed on the circuit board 20. The large electronic components are supported by the resin case 40 and may be attached to the resin case 40 through the adhesive. Each of the capacitors 30 is shaped like a cylinder and has two parallel end surfaces and one curved surface joining the end surfaces.

As shown in FIG. 2, the resin case 40 has supporting portions 40a shaped to fit outer shapes of the large electronic components. Each of the large electronic components is supported by a corresponding one of the supporting portions 40a. The resin case 40 has at least one of the supporting portions 40a on each side. After the large electronic components are supported by the supporting portions 40a, the resin case 40 is placed in the base 10b. Thus, the electronic apparatus 100 can have a high resistance to vibration.

The resin case 40 allows the large electronic components to be arranged in a three-dimensional manner with respect to the mounting surface (i.e., cover 10a) of the electronic apparatus 100. Specifically, the large electronic components are arranged to overlap each other in a direction toward the mounting surface of the electronic apparatus 100. In such an approach, the electronic apparatus 100 can have a small size in a direction along the mounting surface. Accordingly, the electronic apparatus 100 can have a small mounting surface.

In the first embodiment, as shown in FIG. 2, three capacitors 30 are arranged in the three-dimensional manner with respect to the mounting surface of the electronic apparatus 100. Specifically, two capacitors 30 are arranged side by side at the same level with respect to the mounting surface in such a manner that the curved surfaces of the two capacitors 30 face each other. As a result, recessed space is formed between the two capacitors 30. One capacitor 30 is arranged in the recessed space. Accordingly, the resin case 40 has two supporting portions 40a on one side and has one supporting portion 40a on the other side between the two supporting portions 40a in the direction toward the mounting surface. Thus, while the electronic apparatus 100 can have the small mounting surface, an increase in thickness of the electronic apparatus 100 can be minimized.

Further, the busbars 52 are insert-molded with the resin case 40. The large electronic components are electrically connected to the busbars 52 through the leads 51. As described above, the large electronic components are arranged in the three-dimensional manner. Therefore, it may be considered that the busbars 52 need to be arranged in the three-dimensional manner. In the first embodiment, as shown in FIG. 2, each of the large electronic components is electrically connected to a front surface or a back surface of the busbars 52. In such an approach, the busbars 52 can be arranged at the same level with respect to the mounting surface to avoid an increase in manufacturing cost.

Each of the capacitors 30 has electrodes on one end surface. The leads 51 are connected to the electrodes of the capacitors 30. It is preferable that the resin case 40 should have protection area against explosion of the capacitors 30 on the side of the other end surfaces of the capacitors 30.

The connector 55 electrically connects the circuit board 20 and an external device (e.g., a battery, a sensor, an engine actuator, or the like). The connector 55 includes a connector body, the connector pins molded with the connector body, and the conductive lands 54 electrically connected to the connector pins. The connector body is made of an insulating material (e.g., synthetic resin). The connector pins are made of a conducting material (e.g., metal plated brass).

Figure 3A:
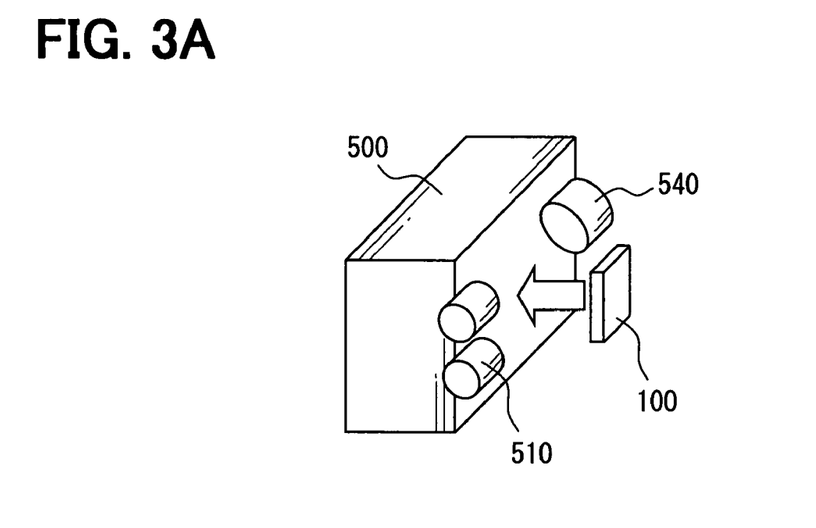
FIG. 3A is a perspective view showing how to mount the electronic apparatus of FIG. 1 to an object.
Figure 3B:
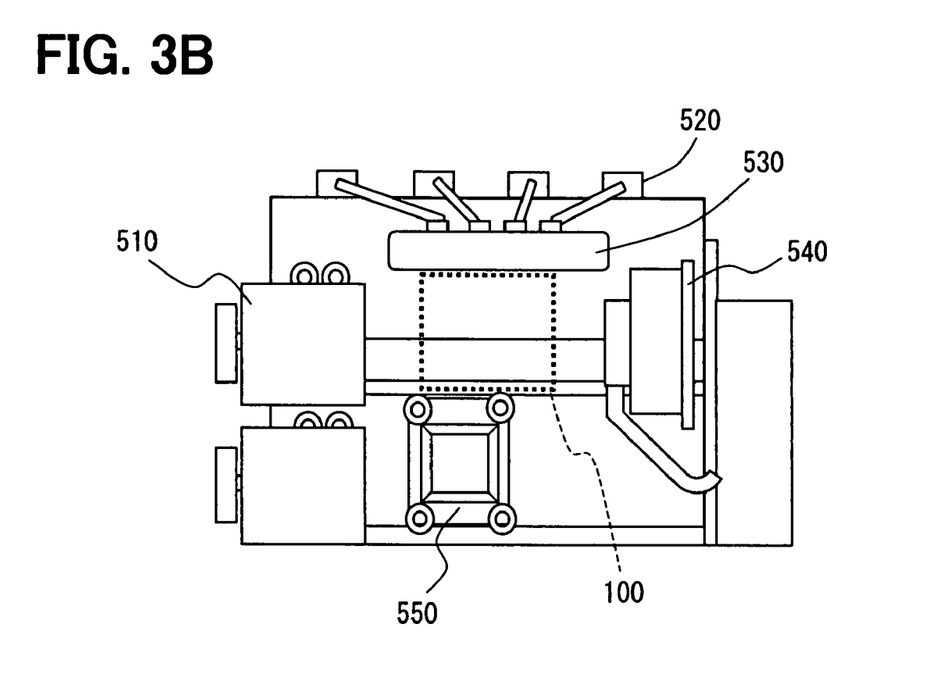
FIG. 3B is a side view showing the object to which the electronic apparatus of FIG. 1 is mounted.

For example, the electronic apparatus 100 is mounted to an engine 500, as shown in FIGS. 3A, 3B. The engine 500 generally includes an alternator 510, an injection valve 520, a common-rail unit 530, a high-pressure fuel pump 540, and an engine mounting bushing 550. The engine 500 has a screw hole (not shown) on a side wall. The electronic apparatus 100 is mounted to the engine 500 by the screw inserted in the screw hole through the mounting hole 11 of the mounting member 11a of the base 10b.

Figure 4:
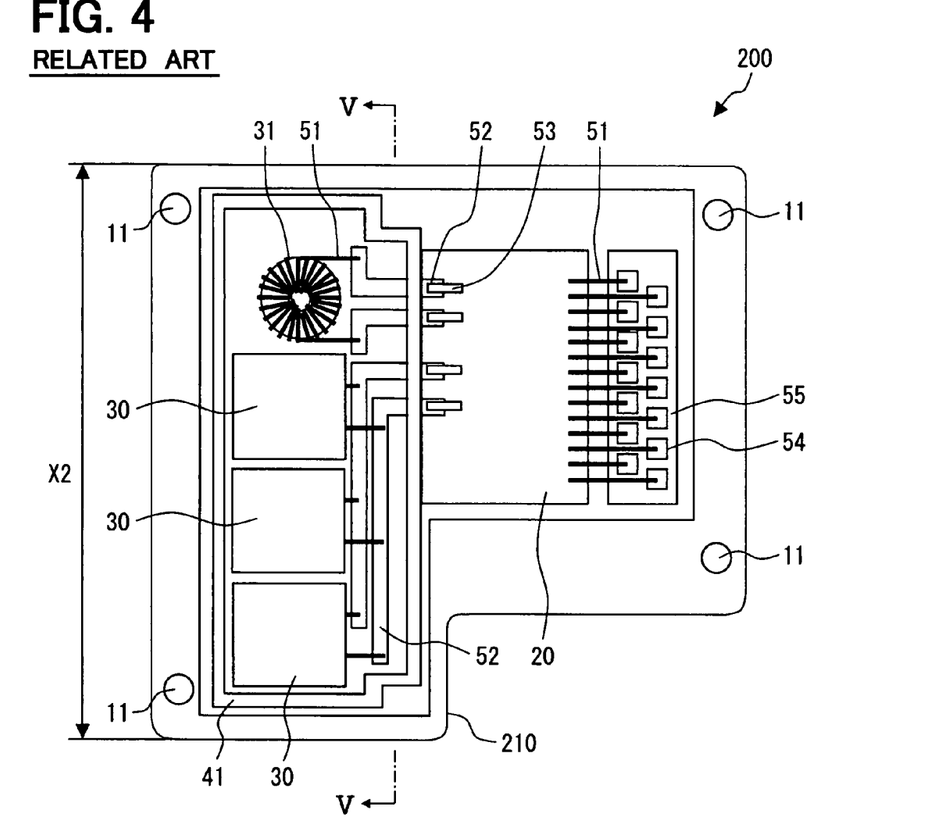
FIG. 4 is a plan view of an electronic apparatus according to a comparative example.
Figure 5:
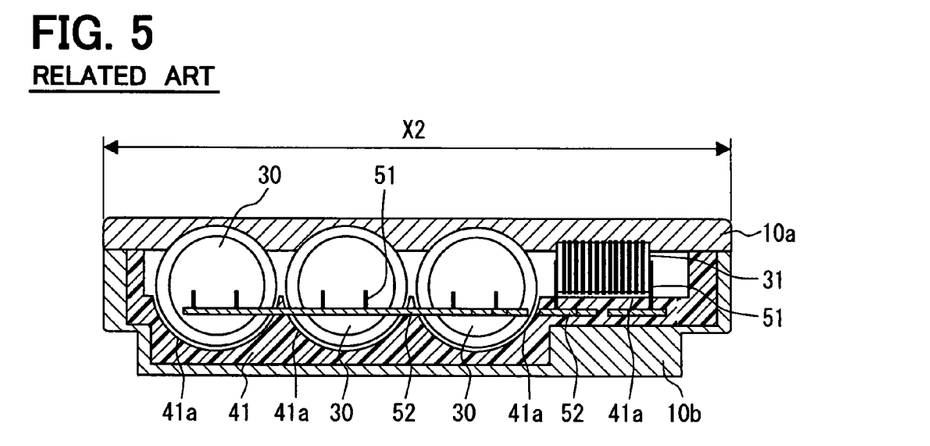
FIG. 5 is a cross-sectional view taken along line V-V in FIG. 4.

A comparison of the three dimensional arrangement and a two-dimensional arrangement is made below. FIGS. 4, 5, show an electronic apparatus 200 that employs the two-dimensional arrangement. In the electronic apparatus 200, the large electronic components are arranged in a two-dimensional manner at the same level with respect to the mounting surface (i.e., cover 10a). In other words, the large electronic components are arranged not to overlap each other in the direction toward the mounting surface. Accordingly, a resin case 41 has supporting portions 41a on one side at the same level with respect to the mounting surface.

As can be seen from comparing FIGS. 1, 2 and FIGS. 4, 5, a length X1 of the electronic apparatus 100 is smaller than a length X2 of the electronic apparatus 200 approximately by one capacitor 30. Accordingly, the mounting surface of the electronic apparatus 100 is smaller than that of the electronic apparatus 200. Therefore, even if the number of the large electronic components included in the electronic apparatus 100 increases, an increase in the mounting surface of the electronic apparatus 100 can be avoided by employing the three-dimensional arrangement.

Recently, exhaust emission standards (especially for diesel vehicles) have been tightened in many counties. To meet the tightened exhaust emission standards, a multistage injection system will be mainstream in a few years. In the multistage injection system, fuel is injected five to nine times per combustion cycle. A conventional engine ECU includes one capacitor for storing energy for driving an injector. The multistage injection system needs large energy for driving the injector to inject the fuel multiple times per combustion cycle. Accordingly, the multistage injection system requires many capacitors. For example, when the fuel is injected five to nine times per combustion cycle, three capacitors are required to store energy for driving the injector.

As described above, there is a trend that the number of capacitors in an engine ECU increases. Further as shown in FIGS. 3A, 3B, the engine 500 includes many devices such as the alternator 510, the injection valve 520, the common-rail unit 530, the high-pressure fuel pump 540, and the engine mounting bushing 550. Accordingly, mounting area where the engine ECU is mounted to the engine 500 is limited. Regarding the engine ECU, therefore, there is a higher demand for reducing the length and width rather than the thickness. In short, an engine ECU having a small mounting surface is highly demanded.

In the electronic apparatus 100 according to the first embodiment, the large electronic components are arranged in the three-dimensional manner by using the resin case 40. Thus, even if the number of the large electronic components included in the electronic apparatus 100 increases, the electronic apparatus 100 can have the small mounting surface. Therefore, the electronic apparatus 100 can be applied to the engine ECU.

Second Embodiment

Figure 6:
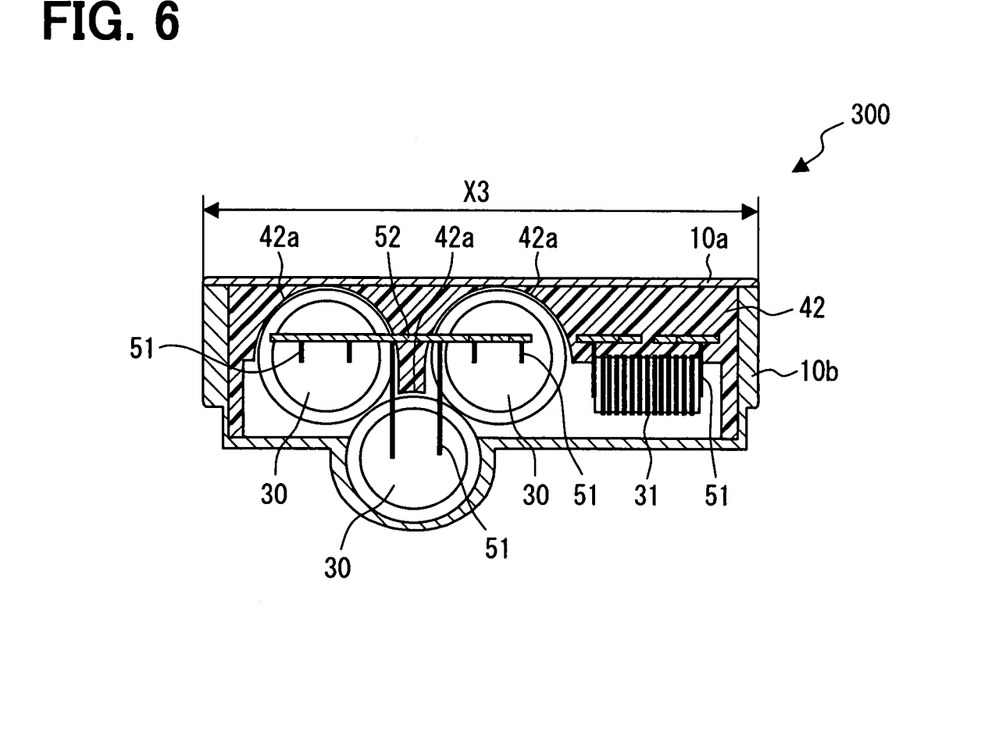
FIG. 6 is a cross-sectional view of an electronic apparatus according to a second embodiment of the present invention.
Figure 7:
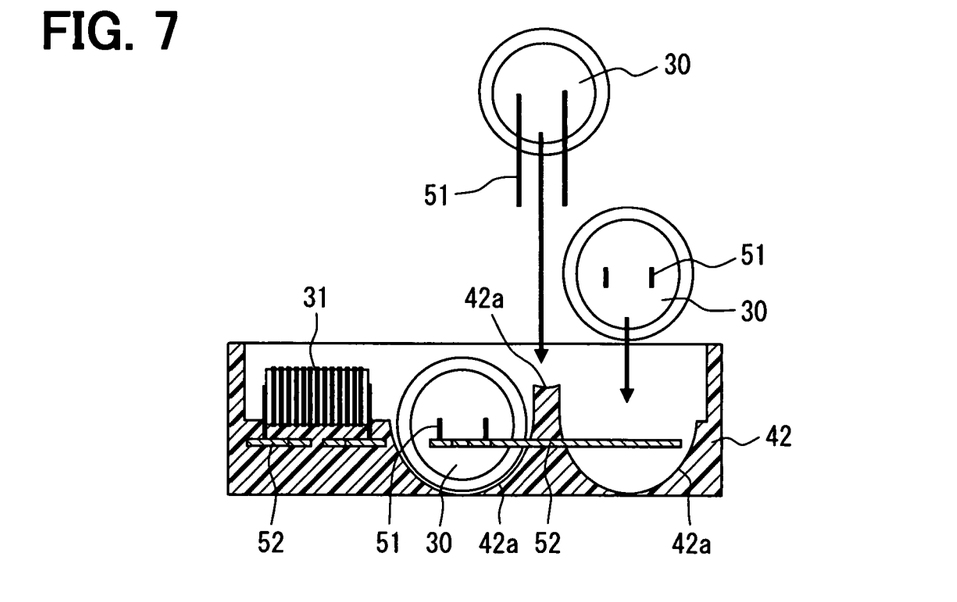
FIG. 7 is an exploded view showing how to assemble the electronic apparatus of FIG. 6.

An electronic apparatus 300 according to a second embodiment of the present invention is shown in FIGS. 6, 7. FIG. 6 corresponds to FIG. 2 of the first embodiment. The electronic apparatus 300 includes a resin case 42 instead of the resin case 40. Whereas the resin case 40 has the supporting portions 40a on each side, the resin case 42 has supporting portions 42a on one side. Adjacent supporting portions 42a are provided at different levels with respect to the mounting surface (i.e., cover 10a) of the electronic apparatus 300. The large electronic components are supported by the supporting portions 42a of the resin case 40.

In the second embodiment, as shown in FIG. 6, three capacitors 30 are arranged in the three-dimensional manner. Specifically, two capacitors 30 are arranged side by side at the same level with respect to the mounting surface in such a manner that the curved surfaces of the two capacitors 30 face each other. As a result, recessed space is formed between the two capacitors 30. One capacitor 30 is arranged in the recessed space. Thus, while the electronic apparatus 300 can have the small mounting surface, an increase in thickness of the electronic apparatus 300 can be minimized.

In the first embodiment, there is a difficulty in placing the large electronic components to the resin case 40, because the resin case 40 has the supporting portions 40a on each side. In contrast, in the second embodiment, the resin case 42 has the supporting portions 42a on one side. Therefore, the large electronic components can be easily placed to the resin case 42.

Further, in the first embodiment, there is a difficulty in electrically connecting the large electronic components and the busbars 52 by the leads 51, because some of the large electronic components are electrically connected to the first surface of the busbars 52, and the others of the large electronic components are electrically connected to the second surface of the busbars 52. In contrast, in the second embodiment, all the large electronic components are electrically connected to one surfaces of the busbars 52 by the leads 51, so that the large electronic components can be electrically connected to the busbars 52 more easily.

As can be seen from comparing FIG. 6 with FIG. 5, a length X3 of the electronic apparatus 300 is smaller than the length X2 of the electronic apparatus 200 approximately by one capacitor 30. Accordingly, the mounting surface of the electronic apparatus 300 is smaller than that of the electronic apparatus 200. Therefore, even if the number of the large electronic components included in the electronic apparatus 300 increases, the increase in the mounting surface of the electronic apparatus 300 can be avoided by employing the three-dimensional arrangement.

In the electronic apparatus 300 according to the second embodiment, the large electronic components are arranged in the three-dimensional manner by using the resin case 42. In such an approach, even if the number of the large electronic components included in the electronic apparatus 300 increases, the electronic apparatus 300 can have the small mounting surface.

Third Embodiment

Figure 8:
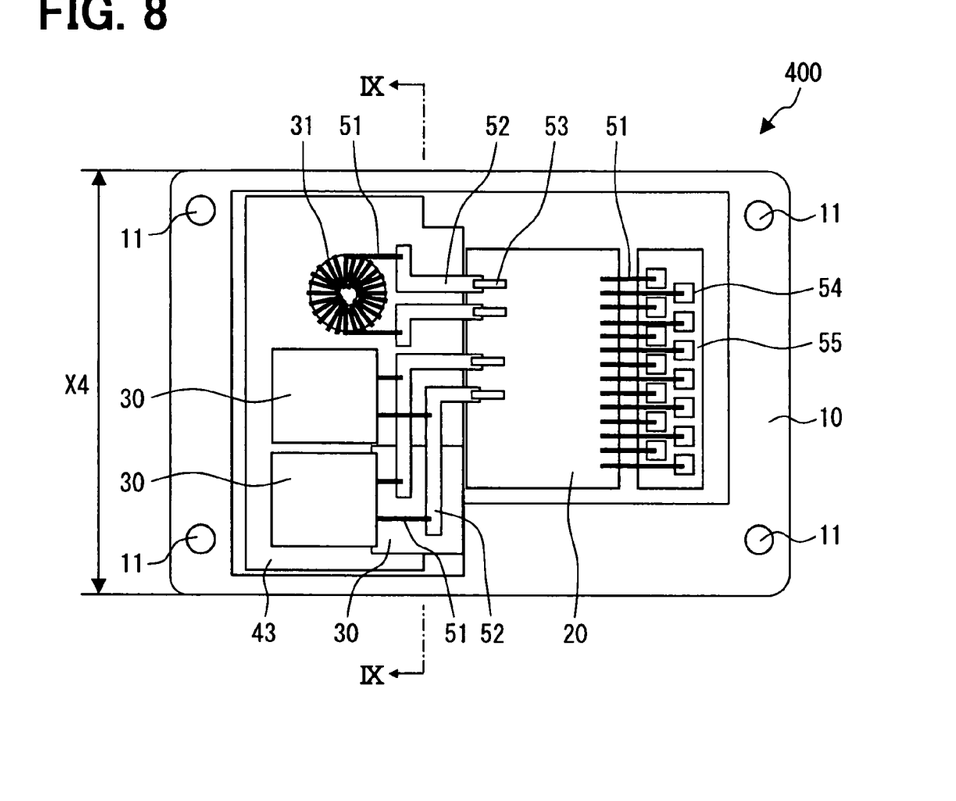
FIG. 8 is a plan view of an electronic apparatus according to a third embodiment of the present invention.
Figure 9:
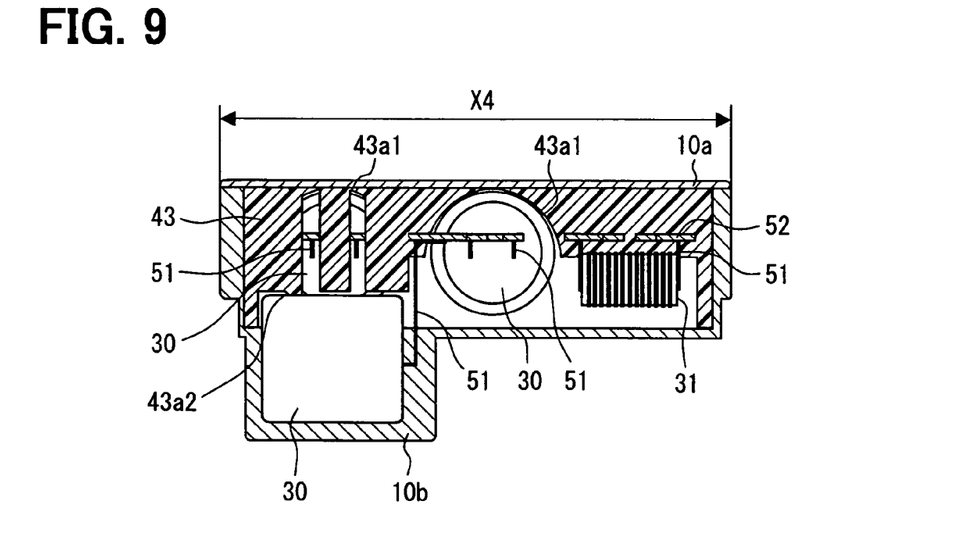
FIG. 9 is a cross-sectional view taken along line IX-IX in FIG. 8.
Figure 10:
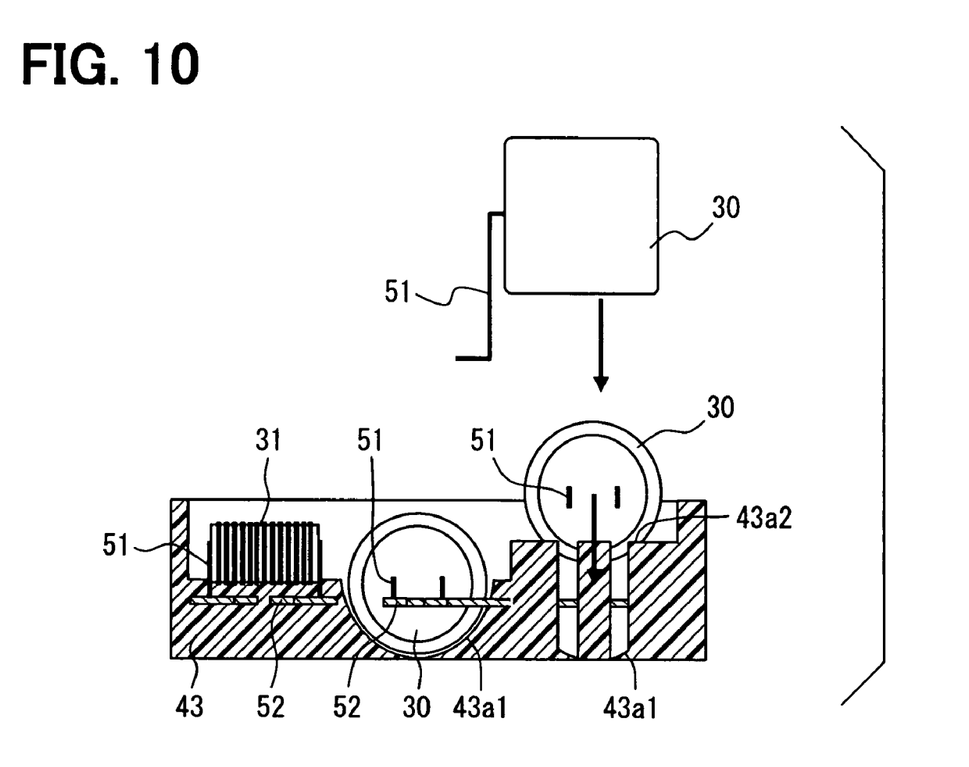
FIG. 10 is an exploded view showing how to assemble the electronic apparatus of FIG. 8.

An electronic apparatus 400 according to a third embodiment of the present invention is shown in FIGS. 8-10. FIG. 8 corresponds to FIG. 1 of the first embodiment. FIG. 9 corresponds to FIG. 2 of the first embodiment. The electronic apparatus 400 includes a resin case 43 instead of the resin case 40. Whereas the resin case 40 has the supporting portions 40a on each side, the resin case 43 has supporting portions on one side. The supporting portions include first supporting portion 43a1s and a second supporting portion 43a2.

The first and second supporting portions 43a1, 43a2 are provided at different levels with respect to the mounting surface (i.e., cover 10a) of the electronic apparatus 400. Further, the first and second supporting portions 43a1, 43a2 are approximately perpendicular to each other. Furthermore, the second supporting portion 43a2 overlaps the busbars 52 in the direction toward the mounting surface to make effective use of space below the busbars 52. Thus, the second supporting portion 43a2 can support a larger electronic component.

In the third embodiment, as shown in FIG. 8, three capacitors 30 are arranged in the three-dimensional manner. Specifically, two capacitors 30 are arranged side by side at the same level with respect to the mounting surface (i.e., cover 10a) of the electronic apparatus 400 in such a manner that the curved surfaces of the two capacitors 30 face each other. The two capacitors 30 are supported by the first supporting portions 43a1. One capacitor 30 supported by the second supporting portion 43a2 is arranged to overlap electrodes of the two capacitors 30 in the direction toward the mounting surface so that the capacitors 30 are stably arranged. Further, by this arrangement, while the electronic apparatus 400 can have the small mounting surface, an increase in thickness of the electronic apparatus 400 can be minimized.

In the third embodiment, the resin case 43 has the supporting portions on one side. Therefore, the large electronic components can be easily placed to the resin case 43. Further, all the large electronic components are electrically connected to one surfaces of the busbars 52 by the leads 51, so that the large electronic components can be easily connected to the busbars 52.

As can be seen from comparing FIGS. 8, 9 and FIGS. 4, 5, a length X4 of the electronic apparatus 400 is smaller than the length X2 of the electronic apparatus 200 approximately by one capacitor 30. Accordingly, the mounting surface of the electronic apparatus 400 is smaller than that of the electronic apparatus 200. Therefore, even if the number of the large electronic components included in the electronic apparatus 400 increases, the increase in the mounting surface of the electronic apparatus 400 can be avoided by employing the three-dimensional arrangement.

In the electronic apparatus 400 according to the third embodiment, the large electronic components are arranged in the three-dimensional manner by using the resin case 43. In such an approach, even if the number of the large electronic components included in the electronic apparatus 400 increases, the electronic apparatus 400 can have the small mounting surface.

(Modifications)

The embodiment described above may be modified in various ways. For example, the large electronic components may be other components than a capacitor and a coil. The electronic apparatus 100, 300, and 400 can be mounted to an object other than an engine.

Such changes and modifications are to be understood as being within the scope of the present invention as defined by the appended claims.

What is claimed is:

1. An electronic apparatus comprising:
    a housing having a mounting member and a mounting surface, the housing being mountable to an object at the mounting surface by the mounting member;
    a circuit board held in the housing; and
        a plurality of large electronic components held in the housing and electrically coupled to the circuit board, wherein
        the plurality of large electronic components are arranged in a three-dimensional manner with respect to the mounting surface,
        the plurality of large electronic components include at least one of a capacitor and a coil,
        the plurality of large electronic components include at least first, second, and third cylindrical components, each of which has two end surfaces and one curved surface joining the end surfaces,
        the first and second cylindrical components are arranged side by side in such a manner that the curved surface of the first cylindrical component face the curved surface of the second cylindrical component to provide space between the curved surfaces, and
        the third cylindrical component is arranged in the space.

2. The electronic apparatus according to claim 1, further comprising:
    a supporting member having a plurality of supporting portions, each of which supports a corresponding one of the plurality of large electronic components.

3. The electronic apparatus according to claim 2, wherein the supporting member has a first portion of the plurality of supporting portions on a first side and has a second portion of the plurality of supporting portions on a second side opposite to the first side.

4. The electronic apparatus according to claim 3, wherein a first one of the first portion of the plurality of supporting portions is provided between a first one of the second portion of the plurality of supporting portions and a second one of the second portion of the plurality of supporting portions in a direction toward the mounting surface.

5. The electronic apparatus according to claim 2, wherein the supporting member has the plurality of supporting portions on one side, and
    a first one of the plurality of supporting portions and a second one of the plurality of supporting portions are adjacent to each other and provided at different levels with respect to the mounting surface.

6. The electronic apparatus according to claim 2, wherein the supporting member has the plurality of supporting portions on one side, and
    a first one of the plurality of supporting portions is approximately perpendicular to a second one of the plurality of supporting portions.

7. The electronic apparatus according to claim 6, wherein a first one of the plurality of large electronic components is supported by the first one of the plurality of supporting portions, and a second one of the plurality of large electronic components is supported by the second one of the plurality of supporting portions, and
    the second one of the plurality of large electronic components overlaps an electrode of the first one of the plurality of large electronic components in a direction toward the mounting surface.

8. The electronic apparatus according to claim 1, further comprising:
    a busbar having a first surface and a second surface, the busbar electrically coupling the plurality of large electronic components to the circuit board, wherein
    the plurality of large electronic components are connected to the first surface or the second surface of the busbar.

9. The electronic apparatus according to claim 1, further comprising:
    a busbar having a first surface and a second surface, the busbar electrically coupling the plurality of large electronic components to the circuit board, wherein
    all the plurality of large electronic components are connected to the first surface of the busbar.

10. The electronic apparatus according to claim 1, further comprising:
    a busbar for electrically coupling the plurality of large electronic components to the circuit board, wherein
    at least one of the plurality of large electronic components overlaps the busbar in a direction toward the mounting surface.

11. The electronic apparatus according to claim 1, wherein the plurality of large electronic components are not placed on the circuit board.

* * * * *